INVENTOR.
ROBERT N. NOYCE
BY
Lippincott & Ralls
ATTORNEYS

INVENTOR.
ROBERT N. NOYCE
BY
Lippincott & Ralls
ATTORNEYS

United States Patent Office 3,117,260
Patented Jan. 7, 1964

3,117,260
SEMICONDUCTOR CIRCUIT COMPLEXES

Robert N. Noyce, Los Altos, Calif., assignor, by mesne assignments, to Fairchild Camera and Instrument Corporation, Syosset, N.Y., a corporation of Delaware
Filed Sept. 11, 1959, Ser. No. 839,447
5 Claims. (Cl. 317—235)

The present invention relates to an improvement in the structure and method of manufacturing semiconductor complexes for unitary solid-state electronic circuits.

Complete electronic circuits may be formed in a single solid unit of semiconducting material such as silicon, however, provision must be made for electrically isolating certain of the circuit elements from each other. Although various different schemes for achieving such isolation have been advanced, difficulties are encountered therewith. Some are quite limited in applicability so that only specific circuits may be formed therefrom and others affording greater isolation are quite complex or costly to manufacture. Thus, while the advantages of unitary solid-state circuits are widely recognized, such circuits are not widely employed.

The present invention is directed to the provision of a unitary circuit complex which is adapted to form the basis of a wide variety of electrical circuits. The circuit complex hereof provides a plurality of zones of semiconducting material in a single block with a high degree of electrical isolation between the zones so that same are adapted for modification in conventional manner to form circuit elements such as semiconductor diodes or transistors. Appropriate conductors which may be plated upon the insulated surface of the complex then serve to complete electrical circuits of a unitary form. Additionally, the method of manufacture herein advanced is very reliable and relatively inexpensive as it includes only proven process steps known and practiced in the semiconductor art.

In brief, the present invention provides a semiconductor circuit complex formed as a wafer, or the like, with a plurality of semiconducting zones therethrough separated by a barrier grid of semiconducting material of opposite polarity. Such a complex configuration provides a pair of spaced P-N junctions between each zone with such junctions being oppositely oriented to thereby provide a high resistance to the flow of current in either direction between the zones. Conventional modification of the zones, as by forming layers of different polarity therein, thus provides circuit elements which are electrically isolated, and conductors plated or otherwise formed upon and through an insulating layer about the wafer then serve to provide a unitary solid-state circuit. The invention further provides a simplified process of manufacture wherein only readily controlled diffusion steps are required to form the wafer of the complex.

In accordance with the foregoing, it is an object of the present invention to provide an improved and simplified method of manufacturing semiconductor circuit complexes of a unitary nature.

It is another object of the present invention to provide a unitary semiconductor circuit complex including a plurality of semiconducting zones electrically isolated from each other by barriers of semiconducting material of a polarity that is opposite to that of the above-noted zones, and providing thereby full electrical isolation between such zones.

It is a further object of the present invention to provide an improved semiconductor circuit complex adapted for utilization as the basis of a unitary solid-state electronic circuit wherein only highly conductive materials are employed, and yet there is provided therein mutually isolated zones having a very high resistance to the flow of current between same.

Various other possible objects and advantages of the present invention will become apparent from the following description of particular preferred embodiments and process steps of the present invention, however no limitation is intended by the terms of the following description and reference is made to the appended claims for a precise delineation of the true scope of this invention.

The invention is illustrated in the accompanying drawings, wherein.

Figure 1:
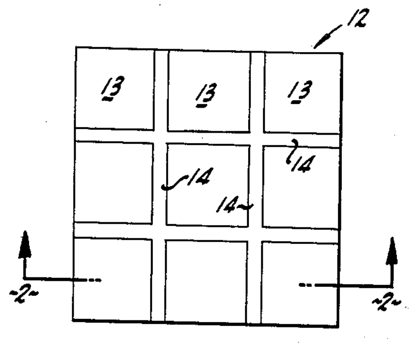
FIG. 1 is a schematic illustration in plan view of one preferred embodiment of the semiconductor circuit complex of the present invention.
Figure 2:
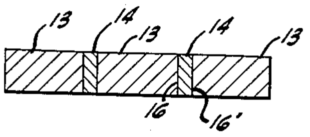
FIG. 2 is a sectional view taken in the plane 2—2 of FIG. 1.

Considering now the present invention in some detail and referring first to the embodiment of the invention illustrated in FIGS. 1 and 2 of the drawing, there will be seen to be therein provided a semiconductor circuit complex wafer 12. The wafer of the complex is illustrated for convenience as being rectangular in plan view, and in accordance with semiconductor practices, has a minimal thickness and may have any desired lateral dimension.

The complex 12 is divided into a plurality of separate zones 13 by means of a diffused grid barrier 14, which will be seen to extend entirely through the wafer and to completely isolate the zones 13 from each other. Each of the zones 13 is formed of a semiconducting material of the same polarity, as for example, N-type silicon, while the grid barrier 14 is formed of a semiconducting material of opposite polarity, as for example, P-type silicon. With the foregoing configuration there are established P-N junctions 16 and 16′ on opposite sides of the barrier 14 and between each of the semiconducting zones 13. The opposite orientation of these P-N junctions provides a high resistance to the flow of current between adjacent zones 13, and in a preferred embodiment of the invention, the barrier width between zones should exceed the diffusion length of minority carriers to afford maximum isolation between the zones.

The above-described circuit complex will be seen to be quite simple of structure and to be readily adapted for appropriate modification of the semiconducting zones 13 therein to form circuit elements therefrom. Even though the semiconducting zones and the intervening barriers are both formed of highly conductive material, there is provided a high degree of electrical isolation between the zones. An electrical circuit analog of the semiconductor circuit complex illustrated in FIG. 2 is a pair of semiconductor diodes connected in back-to-back relationship between adjacent pairs of semiconducting zones 13. The P-N junctions 16 and 16' are oppositely oriented, so that current flow in a forward direction through one thereof into the grid barrier 14 from a zone 13, must of necessity pass in an opposite or reverse direction through the other P-N junction to reach the next adjacent semiconducting zone 13. Consequently, the barrier grid 14 provides a very high resistance between zones 13, equal to the reverse current resistance of the semiconducting diode of the P-N junction provided at the barrier-zone interface.

Figure 3:
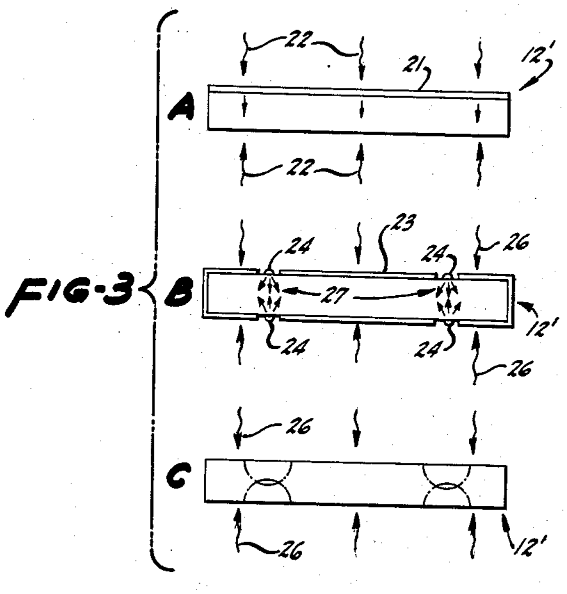
FIG. 3 is a schematic illustration at A, B and C thereof of various steps in the method of manufacturing a semiconductor circuit complex in accordance with the present invention.

Manufacture of the simplified semiconductor circuit complex of FIGS. 1 and 2, described above, may be readily accomplished by utilizing only well-known and readily controlled process steps. Referring to FIG. 3, there is illustrated at A thereof a wafer 12', from which the circuit complex is to be manufactured. This wafer 12' may comprise an N-type semiconducting material such as silicon; same being produced by conventional methods in monocrystalline form. Alternatively, the wafer 12' may contain an insufficient amount of impurities to establish the desired semiconducting properties therein. In this latter instance, the wafer 12' may be further doped by the diffusion of an impurity therein, in conventional manner. In this respect, there is illustrated a layer 21 of a suitable impurity which may be controllably diffused into the wafer 12' by the application of heat, indicated by the arrows 22. Wholly conventional processing may be employed to produce the desired semiconducting wafer of requisite properties, and as an example it may be herein considered that the wafer 12' following diffusion of a donor impurity 21 therein, is an N-type silicon material. A circuit complex is formed in the manner illustrated at FIG. 3B by the controlled diffusion of another impurity into the wafer 12', again in conventional manner. This second diffusion may be carried out by the provision of a conventional mask 23 of oxide, or the like, over the surface of the wafer 12' with suitable openings being provided in such mask whereby an impurity or dopant may be controllably diffused into the wafer from the exterior thereof. In this respect there is shown, merely for illustrative purposes, a dot of material 24 located within each of the openings in the mask 23, whereupon the application of heat as indicated by the arrows 26, serves to diffuse the impurity into the wafer. In the example wherein an N-type silicon wafer is employed, an acceptor impurity is diffused therein to form the barrier grid 14 in the wafer, and, preferably, there is employed in this respect a gaseous diffusion process of conventional nature. In the instance wherein the barrier 14 is to be diffused into the wafer and extending transversely therethrough in the manner illustrated in FIG. 2 of the drawings, it is preferable to diffuse the barrier impurity into the wafer from opposite sides thereof in order to provide for extension of the P-type material entirely through the wafer without undue lateral extension of the diffusion. There is thus illustrated at FIG. 3B the provision of openings in the mask 23, both above and below the wafer, with the impurity or dopant 24 being diffused into the upper and lower side of the wafer, in the manner illustrated by the minute arrows 27 of the drawing. The result of this second diffusion step of the process hereof is illustrated in FIG. 3C, wherein it will be seen that relatively equal diffusion of the impurity in all directions from the point at which same contacts the surface of the wafer, will cause the impurity to be disposed in somewhat of an arcuately defined volume within the wafer, and with the diffusion from both the upper and lower surface of the wafer, such volumes overlap. The diffusion step above is continued until the impurities diffusing into the wafer from opposite sides thereof do, in fact, join to thereby provide a complete barrier entirely through the wafer transversely thereof. It will be appreciated that an impurity may be diffused from but a single side of the wafer with the consequence, however, that the resultant semiconducting material of the barrier so diffused will be wider than that illustrated.

Figure 4:
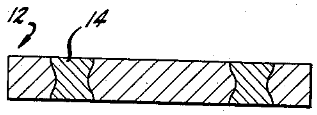
FIG. 4 is a transverse sectional view through a semiconductor circuit complex formed by the process illustrated in FIG. 3.

As a rather apparent alternative to the details of the process above set forth, the zones 13 of the circuit complex may be diffused into a wafer instead of diffusing the barrier therein. In this instance a previously doped wafer of selected polarity is appropriately masked and an impurity is diffused therethrough at a plurality of spaced points to establish zones of opposite polarity. The grid barrier is thus formed of the original wafer semiconductor and fully separates the diffused zones. In FIG. 4 there is illustrated the actual physical structure of a wafer diffused in the manner set forth above in connection with FIG. 3, wherein it will be seen that the P-N junctions between the semiconducting zones and the barrier grid are not straight lines, but are, in fact, curved. This configuration of the P-N junctions in no way reduces the effectiveness of the isolation afforded by the barrier grid disposed between the separate semiconducting zones of the wafer, and in the following description and discussion such junctions are depicted as straight lines merely for convenience of illustration and description.

Figure 5:
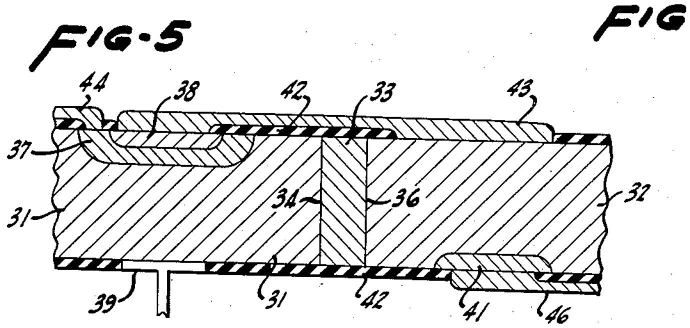
FIG. 5 is a partial transverse sectional view of a semiconductor circuit complex formed in accordance with the present invention, and including modification of zones therein together with a fixed electrical contact and connections illustrative of a manner of employing the circuit complex.
Figure 6:
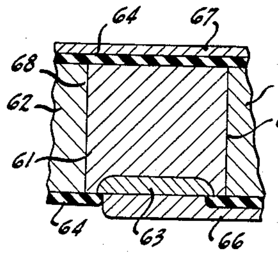
FIG. 6 is a transverse sectional view through a part of a semiconductor circuit complex formed in accordance with the present invention and illustrating certain electrical circuitry which may be formed with the complex hereof.

An almost unlimited variety of electronic circuits may be formed from the semiconductor circuit complex of the present invention, as described above. There is illustrated in FIGS. 5 and 6 certain possible electrical connections and semiconductor zone modifications which may be made to form electronic circuits of a solid-state nature in an integral form, all in accordance with the present invention. As illustrated in FIG. 5, a portion of a semiconductor circuit complex may include first and second semiconducting zones 31 and 32 of N-type semiconductor material such as silicon, for example. These zones are separated, in accordance with the present invention, by a barrier grid 33 of P-type silicon to thereby establish P-N junctions 34 and 36 intermediate the barrier grid 33 and the semiconducting zones 31 and 32, respectively. The zone 31 may be operated upon by appropriate diffusion in conventional manner to form a three-element transistor therefrom, with a base layer 37 being formed by diffusion into the upper surface thereof and an emitter dot 38 being formed by diffusion into this base layer. This transistor will be seen to be an N-P-N transistor, and an electrical terminal may extend from an ohmic contact 39 engaging the collector thereof, for example. The next adjacent zone 32 may be formed into a semiconducting diode, for example, by diffusion to form a layer of P-type semiconducting silicon in the under surface thereof, as indicated at 41 of the drawings. In accordance with conventional transistor practice, a suitable mask 42 may be provided upon all exposed surfaces of the semiconductor circuit complex to protect same from surface contamination, and also to prevent possible shorting of the transistor junctions and P-N junctions of the grid barrier thereof. Electrical connections may be made between the transistor emitter 38, for example, and the N-side of the diode formed in the next adjacent zone 32. Such is herein readily accomplished by the provision of suitable openings in the mask 42 and the plating or other disposition of a metal contact 43 upon the upper surface of the circuit complex, whereby such contact extends through an opening into ohmic contact with the transistor emitter 38 and also through a further opening in the mask into ohmic contact with the semiconducting material 32 of the next adjacent zone. Additional connections to the elements illustrated may include an ohmic contact 44 engaging the transistor base 37 and extending over the mask 42 for connection to other parts of an electronic circuit, as well as an ohmic contact 46, extending into engagement with the diode layer 41 and over the top of the mask 42 for connection to other portions of an electronic circuit. It will be appreciated from the simple illustration and brief description of FIG. 5 that the circuit complex hereof is readily adapted for utilization as an integral unitary electronic circuit by suitable modification of the separated and isolated semiconducting zones of the complex. The P-N junctions 34 and 36 serve to electrically isolate the semiconducting zones 31 and 32 of the complex, so that semiconducting elements formed of these zones are electrically separated, and signals or voltages applied to one zone do not deleteriously affect operation of the next adjacent zone. Modification of the semiconductor circuit complex hereof to form desired electronic circuits may be accomplished in wholly conventional manner by employing manufacturing techniques well known in the semiconductor art, and require no special precautions nor precision operations beyond those normally employed in the semiconductor art.

One further simplified circuit possibility utilizing the semiconductor circuit complex of the present invention is illustrated in FIG. 6, wherein a semiconductor zone 61 is shown as being bounded by grid barrier zones 62 of opposite polarity from the zone 61. As therein shown, the zone 61 is formed into a semiconductor diode by conventional diffusion of a dopant into the under surface of the semiconductor complex wafer to form a layer 63 of opposite type semiconducting material from that of the zone 61. In this instance also, there is provided as is conventional, a suitable electrically insulating mask such as silicon oxide 64, upon the upper and lower surfaces of the complex for purposes as noted above. An ohmic contact 66 is formed in engagement with the diode layer 63 and may extend over the surface of the mask 64 into electrical connection with other circuit elements. Inasmuch as the mask 64 provides electrical insulation upon the surfaces of the wafer, this contact 66 is thus fully electrically insulated from all portions of the wafer except as desired. Atop the circuit complex, there may be formed as by plating, an electrical contact or conductor 67 upon the mask 64 and extending, for example, between a pair of other circuit elements of an overall circuit formed from the complex. It will be appreciated that the provision of the mask 64 between the conductor 67 and semiconducting material 61, will provide a capacitive coupling between these elements, so that the partial structure illustrated in FIG. 6 forms a semiconducting diode fully isolated from adjacent elements by oppositely oriented P-N junctions 68 and capacitively coupled to the conductor 67. By the utilization of appropriate circuit connections, zone modifications, and various other physical attachments and modifications of the circuit complex hereof, it is possible to form substantially any desired electronic circuit having a large plurality of circuit elements to thereby perform substantially any electronic function that may be carried out by more conventional electronic circuitry.

Figure 7:
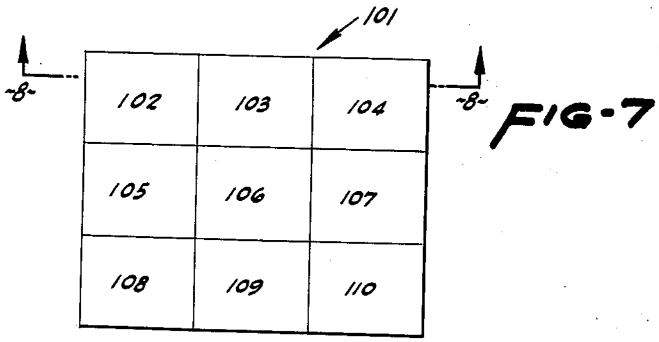
FIG. 7 is a plan view of an alternative embodiment of the semiconductor circuit complex of the present invention.
Figure 8:
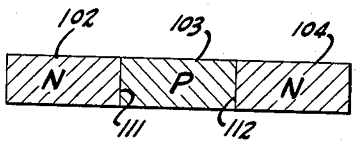
FIG. 8 is a sectional view taken in the plane 8—8 of FIG. 7.

An alternative embodiment of the present invention illustrated at FIGS. 7 and 8 of the drawings is adapted to provide a circuit complex having a finite resistance between zones of like polarity rather than the substantially complete isolation afforded by the above-described embodiment. Referring to these figures, there will be seen to be provided a circuit complex 101, illustrated for convenience as a rectangle in plan view, with a minimal thickness. This circuit complex is divided into a checkerboard by the zones or areas 102—110, as shown in FIG. 7. In distinction to the structure described above, the semiconductor circuit complex of this embodiment includes only semiconducting zones extending through the wafer, with each of such zones being adapted for modification into circuit elements. While a certain amount of electrical isolation is afforded between the separate zones of the checkerboard, it will be appreciated that a limited connection of zones of like polarity occurs at the corners of the zones. The separate semiconducting zones of the present embodiment will thus be seen to be interconnected through relatively high resistance paths at the corners thereof. As shown in FIG. 8, the zones 102 and 104 may be considered as being formed of N-type semiconducting material with the intervening zone 103 formed of a P-type semiconducting material. This structure provides a P-N junction 111 between the zones 102 and 103, and likewise a P-N junction 112 between the zones 103 and 104. Although this physical structure does not afford the same electrical isolation between zones of like polarity as does the embodiment described above, there is provided the equivalent of a single P-N junction between each of the adjacent zones of the checkerboard. This semiconductor diode isolation between adjacent zones and limited connection between zones of like polarity is suited to particular applications of semiconductor circuit complexes wherein a relatively limited isolation is required between the zones thereof. Advantage lies in this particular embodiment of the invention in that the method of manufacture is quite simple, inexpensive, and readily controlled.

Figure 9:
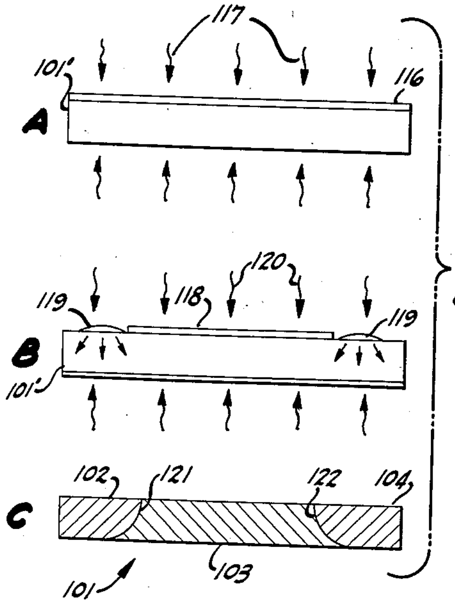
FIG. 9 is a schematic illustration of separate steps of manufacture, as they may be employed in producing the semiconducting circuit complex of FIGS. 7 and 8.

Manufacture of the checkerboard circuit complex disclosed above, may be carried out with wholly conventional semiconductor manufacturing steps, and as illustrated in FIG. 9, manufacture may be initiated from a wafer 101 of either N or P-type semiconducting material. In the event that the wafer to be formed into the circuit complex does not have a desired semiconducting property as originally provided, it is possible to further diffuse an impurity therein as indicated by FIG. 9A, wherein a layer 116 of a selected impurity is diffused into the wafer 101′ by the application of heat, indicated by the arrows 117. Following the provision of a wafer of single semiconducting polarity, there is controllably diffused therein a additional dopant or impurity which provides an opposite polarity to the semiconducting material into which same is diffused. As indicated at FIG. 9B, a mask 118 is preferably provided over the surface of the water 101′ to limit the area of the wafer exposed to diffusion of the selected dopant or impurity. Although it is conventional to employ gaseous diffusion, there is illustrated at FIG. 9B for simplicity, the provision of a material 119 upon the surface of the wafer 101′, whereupon the application of heat as indicated by the arrows 120, serves to diffuse such impurity 119 into the wafer and thereby form the semiconductor circuit complex 101, as illustrated at 9C. With an N-type wafer, an acceptor impurity 119 may be diffused into the wafer to thereby form P-type zones 102 and 104, whereby P-N junctions 121 and 122 will be produced between such zones and an intermediate zone 103 of N-type silicon. Here, again, the junctions 121 and 122 will be seen to have a curved configuration. However, such is of no disadvantage, inasmuch as the junction properties remain the same, and the same degree of isolation is afforded between adjacent zones as if the junction actually were a straight line, as indicated in FIG. 8. It will be seen that while the manufacturing process described in connection with FIG. 3, is quite similar to that described in connection with FIG. 9, the latter process is somewhat simplified in that the control over location of openings in the mask upon the semiconducting wafer is not so critical in the latter instance. Certain manufacturing advantages are realized with the latter-described embodiment of the semiconductor circuit complex of the present invention, and thus in those instances wherein the full isolation of back-to-back semiconductor diodes is not required, it is preferable to employ the complex configuration of FIGS. 7 and 8.

In the above description of the present invention as regards the semiconductor circuit complex structure and methods of manufacture thereof, there has been made no mention of the physical size of the complex, or of the individual zones or barriers therein. In accordance with conventional semiconductor manufacturing practice, a relatively minute wafer size would normally be employed, with the size of the individual zones thereof provided for modification into such as transistors or diodes being only adequate to accommodate such modification. As a consequence, the overall size of the semiconductor circuit complex of the present invention is quite minute, with the overall size being determined by the number of zones provided for any particular application, as dictated by the number of separate transistors or diodes which are desired in the final circuit. An overall lateral dimension of the order of a centimeter provides sufficient size for the wafer hereof to accommodate the inclusion of a large number of semiconducting devices therein, and serves thereby to provide for unitary solid-state electronic circuits of maximized miniaturization.

I claim:

1. A semiconductor circuit complex comprising a monocrystalline wafer of semiconductor material having selected donor and acceptor impurities dispersed in separate zones therein and defining a checkerboard of alternate P-type and N-type semiconducting zones extending transversely through said wafer to substantially isolate zones of one polarity from other zones of like polarity.

2. A semiconductor circuit complex for unitary solid-state electronic circuits comprising a wafer of semiconducting material of a first polarity divided into separate zones by a grid of semiconducting material of a different polarity, said grid extending transversely through the wafer and isolating said zones by pairs of oppositely disposed junctions with each portion of said grid having a width between zones in excess of the diffusion length of minority carriers therein.

3. A semiconductor circuit complex for solid-state electronic circuits comprising a thin wafer of semiconducting material having a plurality of zones of the same conductivity type extending transversely therethrough and separated from each other by an elongated barrier of semiconducting material of opposite conductivity type extending transversely through the wafer and completely surrounding all sides of at least one of said zones.

4. A unitary solid-state electronic circuit comprising a single wafer of semiconducting material divided into zones extending transversely through the wafer by barriers of semiconducting material of an opposite conductivity type to isolate said zones from each other, layers of a different conductivity type semiconducting material diffused into said zones to form semiconducting devices thereof, an insulating mask disposed over the surface of said wafer, and electrical connections upon said mask extending therethrough into contact with selected portions of said zones.

5. A semiconductor circuit complex comprising a single unitary wafer of semiconducting material of a first polarity having a plurality of separate islands therein of a semiconducting material of a second opposite polarity, said islands having material of said first polarity disposed thereon, forming P-N junctions with the material of said islands and being wholly separated from each other by material of said first polarity to dispose oppositely oriented P-N junctions between said islands for electrical isolation of the islands from each other.

References Cited in the file of this patent

UNITED STATES PATENTS

| | | |
|---|---|---|
| 2,588,254 | Horovitz et al. | Mar. 4, 1952 |
| 2,666,814 | Shockley | Jan. 19, 1954 |
| 2,813,048 | Pfann | Nov. 12, 1957 |
| 2,889,469 | Green | June 2, 1959 |
| 2,912,598 | Shockley | Nov. 10, 1959 |
| 2,918,628 | Stuetzer | Dec. 22, 1959 |
| 2,919,299 | Paradise | Dec. 29, 1959 |
| 2,936,384 | White | May 10, 1960 |
| 2,944,165 | Stuetzer | July 5, 1960 |
| 2,954,307 | Shockley | Sept. 27, 1960 |
| 2,989,713 | Warner | June 20, 1961 |
| 3,044,909 | Shockley | July 17, 1962 |
| 3,064,167 | Hoerni | Nov. 13, 1962 |